United States Patent [19]

Nakamura et al.

[11] Patent Number: 4,723,194
[45] Date of Patent: Feb. 2, 1988

[54] STRUCTURE OF CAPACITOR CIRCUIT

[75] Inventors: Yasuyuki Nakamura; Takahiro Miki, both of Itami, Japan

[73] Assignee: Mitsubishi Denki Kabushiki Kaisha, Tokyo, Japan

[21] Appl. No.: 911,434

[22] Filed: Sep. 25, 1986

[30] Foreign Application Priority Data

Sep. 26, 1985 [JP] Japan ................. 60-215476

[51] Int. Cl.[4] .............. H01G 4/38; G11C 11/24
[52] U.S. Cl. ........................ 361/330; 357/54
[58] Field of Search ............... 361/330; 357/51, 54

[56] References Cited

U.S. PATENT DOCUMENTS

| 4,190,849 | 2/1980 | Powell | 357/54 X |
| 4,274,012 | 6/1981 | Simko | 357/54 X |
| 4,283,439 | 8/1981 | Higashinakagawa et al. | 357/54 X |

FOREIGN PATENT DOCUMENTS 2743422  3/1979  Fed. Rep. of Germany ... 357/54 M

Primary Examiner—Donald A. Griffin
Attorney, Agent, or Firm—Lowe, Price, Leblanc, Becker & Shur

[57] ABSTRACT

A structure of a capacitor circuit in accordance with the present invention comprises a plurality of capacitors formed on a semiconductor or conductor substrate in a manner in which insulating films and electrodes are provided alternately. This structure is characterized in that: there are provided a first capacitor and a second capacitor adjacent to each other; the first capacitor and the second capacitor comprise, respectively, first electrodes formed on the substrate through the first insulating film, second electrodes formed on the first electrodes through the second insulating film and third electrodes formed on the second electrodes through the third insulating film, the third electrode of the first capacitor being connected to the second electrode of the second capacitor.

4 Claims, 3 Drawing Figures

STRUCTURE OF CAPACITOR CIRCUIT

BACKGROUND OF THE INVENTION

1. Field of the Invention

The present invention relates to a structure of a capacitor circuit and particularly to a structure of a capacitor circuit which makes it possible to remove stray capacitance of the capacitor circuit.

2. Description of the Prior Art

FIG. 2 is a sectional view showing an example of a conventional structure of a capacitor circuit for distributing input electric charge in a binary manner. First, this structure will be described. Referring to FIG. 2, a first insulating film 51 is formed on a conductor or semiconductor substrate 50 and first electrodes 1, 3, 5, 7, 9, 11 and 13 are formed with spacings on the first insulating film 51. A second insulating film 52 is formed on the first insulating film 51 and the first electrodes 1, 3, 5, 7, 9, 11 and 13 and then second electrodes 2, 4, 6, 8, 10, 12 and 14 are formed with spacings on the second insulating film 52. A capacitor 101 is formed by the substrate 50, the first insulating film 51, the first electrode 1, the second insulating film 52 and the second electrode 2; a capacitor 102 is formed by the substrate 50, the first insulating film 51, the first electrode 3, the second insulating film 52 and the second electrode 4; and subsequently capacitors 103, 104, 105, 106 and 107 are formed in the same manner. The second electrode 2 of the capacitor 101 and the first electrode 3 of the capacitor 102 are connected by a connection portion 15; the second electrode 4 of the capacitor 102 and the second electrode 16 of the capacitor 103 are connected by a connection portion 6; and other electrodes are connected by connection portions 17, 18, 19 and 20 in the same manner, respectively. The area of each of the first electrodes 3, 7, 11 and 13 and the second electrodes 4, 8, 12 and 14 of the capacitors 102, 104, 106 and 107, respectively, is twice as large as the area of each of the first electrodes 1, 5 and 9 and the second electrodes 2, 6 and 10 of the capacitors 101, 103 and 105, respectively, so that input electric charge may be distributed in a binary manner. Thus, assuming that the capacitance of each of the capacitors 101, 103 and 105 is C, the capacitance of each of the capacitors 102, 104, 106 and 107 is 2C.

FIG. 3 is an equivalent circuit diagram of the circuit shown in FIG. 2. Referring to FIG. 3, the reference numeral 15 indicates a node between the second electrode 2 and the first electrode 3; the reference numeral 17 indicates a node among the second electrode 4, the second electrode 6 and the first electrode 7; the reference numeral 19 indicates a node among the second electrode 8, the second electrode 10 and the first electrode 11; and the reference numeral 20 indicates a node between the second electrode 12 and the second electrode 14.

The operation of the above stated circuit will be described in the following with reference to FIG. 3. If there is no stray capacitance at the nodes 15, 17, 19 and 20, the capacitance as viewed to the right side from each of the nodes 15, 17 and 20 is equal to C. More specifically, when an input charge Q is applied to the node 15, the capacitance as viewed to the right side from the node 15 is C and electric charge of Q/2 is applied to each of the capacitors 101 and 102. In the same manner, the capcacitance as viewed to the right side from the node 17 is C and electric charge of Q/4 is applied to each of the capacitors 103 and 104; the capacitance as viewed to the right side from the node 19 is C and electric charge of Q/8 is applied to each of the capacitors 105, 106 and 107; and thus the input electric charge is distributed in a binary manner.

However, in such a conventional electric charge distributing circuit, a stray capacitance actually exists between each of the first electrodes 1, 3, 5, 7, 9, 11, and 13 and the substrate 50. More specifically, stray capacitances exist at the nodes 15, 17, 19 and 20 shown in FIG. 3 and, as a result, the capacitance as viewed to the right side from each of the nodes 15, 17 and 19 can not be made to be exactly C, causing decrease in the precision of electric charge distribution.

The present invention has been accomplished to overcome the above described disadvantages and it is an object of the present invention to provide a structure of a capacitor circuit which can attain a high precision of electric charge distribution.

SUMMARY OF THE INVENTION

A structure of a capacitor circuit in accordance with the present invention is formed in a manner in which insulating films and electrodes are provided alternately on a semiconductor or conductor substrate to form a plurality of capacitors on the substrate. This structure comprises a first capacitor and a second capacitor adjacent to each other and the first and second capacitors each comprise a first electrode formed on the substrate through a first insulating film, a second electrode formed on the first electrode through a second insulating film, and a third electrode formed on the second electrode through the third insulating film, the third electrode of the first capacitor being connected to the second electrode of the second capacitor.

According to the present invention, the respective first electrodes exist between the respective second electrodes and the substrate and no stray capacitance exists among the second electrodes, the third electrodes and the substrate. Therefore, a structure of a capacitor circuit having a high precision of electric charge distribution can be obtained.

These objects and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention will be described with reference to the drawings.

Figure 1:
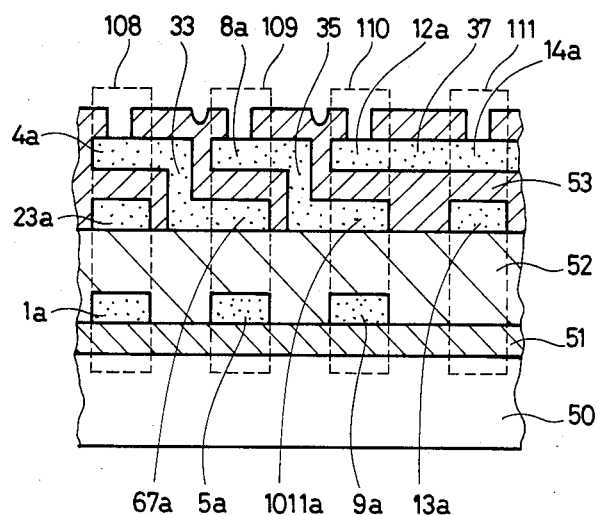
FIG. 1 is a sectional view showing a structure of an electric charge distributing circuit as a capacitor circuit in accordance with an embodiment of the present invention.

FIG. 1 is a sectional view showing a structure of a capacitor circuit in accordance with an embodiment of the present invention, specifically illustrating, a structure of an electric charge distributing circuit for distributing input electric charge in a binary manner.

First, the structure of this circuit will be described. Referring to FIG. 1, a first insulating film 51 is formed on a semiconductor or conductor substrate 50 and first electrodes 1a, 5a and 9a are formed on this first insulating film 51 so as to be spaced from one another. A second insulating film 52 is formed on the first insulating film 51 and the first electrodes 1a, 5a and 9a. Second electrodes 23a, 67a, 1011a and 13a are formed with spacings on this second insulating film 52. Third electrodes 4a, 8a, 12a and 14a are formed with spacings on the second insulating film 52, the second electrodes 23a, 67a, 1011a and 13a through the third insulating film 53. The substrate 50, the first insulating film 51, the first electrode 1a, the second insulating film 52, the second electrode 23a, the third insulating film 53 and the third electrode 4a form a capacitor 108. The substrate 50, the first insulating film 51, the first electrode 5a, the second insulating film 52, the second electrode 67a, the third insulating film 53 and the third electrode 8a form a capacitor 109. Capacitors 110 and 111 are formed in the same manner. The third electrode 4a of the capacitor 108 and the second electrode 67a of the capacitor 109 are connected by a connection portion 33; the third electrode 8a of the capacitor 109 and the second electrode 1011a of the capacitor 110 are connected by a connection portion 35; and the third electrode 12a of the capacitor 110 and the third electrode 14a of the capacitor 111 are connected by a connection portion 37. In the capacitors 108, 109 and 110, the thickness of the second insulating film 52 between the first electrode 1a and the second electrode 23a, between the first electrode 5a and the second electrode 67a and between the first electrode 9a and the second electrode 1011a is made to be twice as large as the thickness of the third insulating film 53 between the second electrode 23a and the third electrode 4a, between the second electrode 67a and the third electrode 8a and between the second electrode 1011a and the third electrode 12a so that input electric charge may be distributed in a binary manner. Briefly stated, assuming that the capacitance between the respective associated first and second electrodes is C, the capacitance between the respective associated second and third electrodes is 2C.

Figure 2:
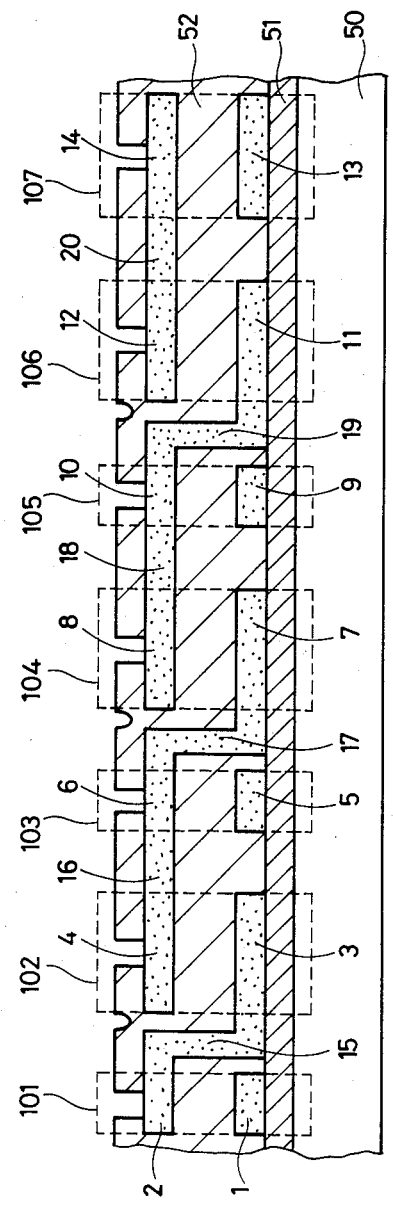
FIG. 2 is a sectional view showing a conventional structure of an electric charge distributing circuit as a capacitor circuit.
Figure 3:
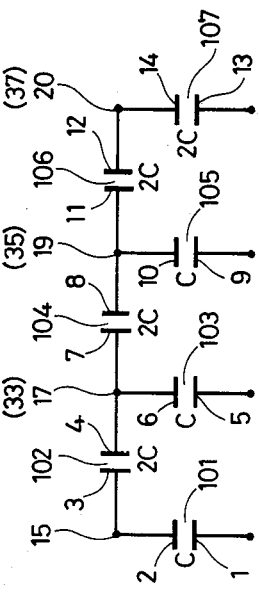
FIG. 3 is an equivalent circuit diagram of the electric charge distributing circuits shown in FIGS. 1 and 2.

As for the relation among FIGS. 1, 2 and 3, the first electrodes 1a, 5a and 9a in FIG. 1 correspond to the first electrodes 1, 5 and 9 in FIG. 2, respectively; the second electrodes 23a, 67a, 1011a and 13a in FIG. 1 correspond to a region including the second electrode 2 and the first electrode 3, a region including the second electrode 6 and the first electrode 7, a region including the second electrode 10 and the first electrode 11, and the first electrode 13, respectively; and the third electrodes 4a, 8a, 12a and 14a in FIG. 1 correspond to the second electrodes 4, 8, 12 and 14 in FIG. 2, respectively. The connection portions 33, 35 and 37 correspond to the nodes 17, 19 and 20 in FIG. 3, respectively. More specifically, the capacitor 108 is formed by connecting in series the capacitors 101 and 102 in FIG. 3; the capacitor 109 is formed by connecting in series the capacitors 103 and 104 in FIG. 3; the capacitor 110 is formed by connecting in series the capacitors 105 and 106 in FIG. 3; and the capacitor 111 is the capacitor 107 in FIG. 3.

In the following, the operation of the above described circuit will be described with reference to FIG. 3. Since the first electrodes 1a, 5a, 9a and the second electrode 13a are provided between the second electrode 23a or the third electrode 4a and the substrate 50, between the second electrode 67a or the third electrode 8a and the substrate 50, between the second electrode 1011a or the third electrode 12a and the substrate 50, and between the third electrode 14a and the substrate 50, respectively, no stray capacitance exists between those portions. More specifically, the capacitance as viewed from each of the nodes 15, 33 and 35 to the right side is exactly C because no stray capacitance exists at the nodes 15, 33, 35 and 37 in FIG. 3. Consequently, when input electric charge Q is applied to the node 15, the capacitance as viewed from the node 15 to the right side becomes exactly C and electric charge of Q/2 is applied to each of the capacitors 101 and 102. Similarly, the capacitance as viewed form the node 33 to the right side becomes exactly C and electric charge of Q/4 is applied to each of the capacitors 103 and 104. The capacitance as viewed from the node 35 to the right side becomes exactly C and electric charge of Q/8 is applied to each of the capacitors 105, 106 and 107. Thus, the input electric charge is distributed in a binary manner with high precision.

Although the structure of three layers having capacitances C and 2C was used in the above described embodiment, a structure of more than three layers may be used and the ratio of the thicknesses of the insulating films among the electrodes and the ratio of the areas of the electrodes may be changed. In such cases, the same effect as in the above described embodiment can also be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A structure of a capacitor circuit formed in a manner in which insulating films and electrodes are provided alternately on a semiconductor or conductor substrate whereby a plurality of capacitors are formed on said substrate, said structure comprising
    a first capacitor and a second capacitor adjacent to each other, said first and second capacitors each comprising a first electrode formed on said substrate through a first insulating film, a second electrode formed on said first electrode through a second insulating film and a third electrode formed on said second electrode through a third insulating film, the third electrode of said first capacitor being connected to the second electrode of said second capacitor.

2. A capacitor circuit for distributing electric charge in a binary manner, comprising insulating films and electrodes alternately provided on a substrate whereby a plurality of capacitors are formed on said substrate, said capacitor circuit including:
    first and second capacitors adjacent to each other, each comprising first, second and third electrodes, said first electrode of each capacitor formed over said substrate and separated therefrom by a first insulating film, said second electrode of each capacitor formed over a corresponding first electrode and separated therefrom by a second insulating film, and a third electrode formed over a corresponding second electrode and separated therefrom by a corresponding third insulating film,
    the third electrode of said first capacitor connected to the second electrode of said second capacitor, each of said first and second capacitors having a capacitance between the respective second and third electrodes thereof which is twice the capacitance between the respective first and second electrodes thereof.

3. A capacitor circuit for distributing electric charge in a binary manner as recited in claim 2, wherein said second insulating film has a thickness twice as large as a thickness of said third insulating film, thereby providing said capacitance between said second and third electrodes to be twice the capacitance between said first and second electrodes.

4. A capacitor circuit for distribution electric charge in a binary manner as recited in claim 2 wherein said third insulating film includes a portion over said third electrodes of said first and second capacitors, said portion of said third insulating film including openings for contacting said third electrodes.

* * * * *